(12) United States Patent
Yang et al.

(10) Patent No.: US 9,219,449 B2
(45) Date of Patent: Dec. 22, 2015

(54) CTIA FOR IR READOUT INTEGRATED CIRCUITS USING SINGLE ENDED OPAMP WITH IN-PIXEL VOLTAGE REGULATOR

(71) Applicants: Guang Yang, Pasadena, CA (US); Jonathan Bergey, Pasadena, CA (US)

(72) Inventors: Guang Yang, Pasadena, CA (US); Jonathan Bergey, Pasadena, CA (US)

(73) Assignee: Forza Silicon Corporation, Pasadena, CA (US)

( * ) Notice: Subject to any disclaimer, the term of this patent is extended or adjusted under 35 U.S.C. 154(b) by 223 days.

(21) Appl. No.: 13/948,924

(22) Filed: Jul. 23, 2013

(65) Prior Publication Data

US 2014/0027639 A1    Jan. 30, 2014

Related U.S. Application Data

(60) Provisional application No. 61/675,213, filed on Jul. 24, 2012.

(51) Int. Cl.
*H03F 3/08*    (2006.01)

(52) U.S. Cl.
CPC ..................... *H03F 3/087* (2013.01)

(58) Field of Classification Search
CPC ......................................... H03F 3/087
See application file for complete search history.

(56) References Cited

U.S. PATENT DOCUMENTS

| | | | | |
|---|---|---|---|---|
| 6,885,396 | B1* | 4/2005 | Panicacci et al. | 348/241 |
| 2004/0011962 | A1* | 1/2004 | Chin et al. | 250/370.08 |
| 2004/0046101 | A1* | 3/2004 | Nakamura et al. | 250/200 |
| 2005/0264660 | A1* | 12/2005 | Simony | 348/241 |
| 2007/0279508 | A1* | 12/2007 | Fowler | 348/311 |
| 2009/0091648 | A1* | 4/2009 | Lin et al. | 348/301 |
| 2011/0267505 | A1* | 11/2011 | Dierickx | 348/241 |

* cited by examiner

*Primary Examiner* — Mark R Gaworecki
(74) *Attorney, Agent, or Firm* — Law Office of Scott C Harris, Inc

(57) ABSTRACT

A circuit for an image sensor pixel receives photogenerated information from an image sensor, such as infrared sensor. The circuit includes a single ended operational amplifier, they can have a simple circuit such as for example 4 transistors. An additional transistor is used in the pixel to regulate the voltage that is used to drive the operational amplifier, to maintain that voltage relative to a bias level. This prevents voltage fluctuations, which would otherwise be passed to the pixel output.

10 Claims, 2 Drawing Sheets

CTIA FOR IR READOUT INTEGRATED CIRCUITS USING SINGLE ENDED OPAMP WITH IN-PIXEL VOLTAGE REGULATOR

This application claims priority from Provisional application No. 61/675,213, filed Jul. 24, 2012, the entire contents of which are herewith incorporated by reference.

BACKGROUND

A typical Charge Trans-Impedance Amplifier CTIA-based IR pixel using a single ended OPAMP is shown in FIG. 1. In this figure, VAVDD is the OPAMP power supply (i.e., VDD_AMP). FIG. 1 shows a single pixel 100, that has an IR photodetector 105. A single ended op amp 110 is shown that has four (4) different transistors. This is shown in this way, with other transistors, such as cascode transistors, being eliminated to further reduce the pixel area/size. A reset transistor 115 is shown as a switch across a feedback capacitor (C_FB) 120.

The circuit also includes a signal sampling capacitor (C_SIG) 125 that holds the value of the pixel ones sample. The output stage 130 produces the output.

Using a single ended OPAMP in this way in the CTIA IR readout circuit can minimize the number of transistors that exist in the pixel. This in turn allows reducing the pixel size to provide for smaller pixel, large format IR image sensor applications.

However, such a single ended OPAMP in CTIA circuit has a very poor power supply rejection ratio, for example on the order of 0 dB. This means that, noise from the power supply will be directly coupled to the CTIA output. The noise could be very high in a large format sensor.

SUMMARY

According to embodiments, a single transistor is added to an image sensor pixel to act to regulate the pixel output power supply rejection ratio (PSRR). This can be used to reduce the pixel output noise readout.

An embodiment as a single additional transistor to the single ended op amp, to regulate the voltage supply used by the single ended op amp.

DETAILED DESCRIPTION

An embodiment describes an approach to enhance a Power Supply Rejection Ratio (PSRR) of a Charge Trans-Impedance Amplifier (CTIA) with a single ended op amp. In one embodiment, this is used for Infrared Readout Integrated Circuits (IR ROIC). A CTIA using a single ended OPAMP can save the layout real estate in the pixel to obtain a smaller pixel size. However, the PSRR is essentially 0 dB in such a circuit. Without any power supply rejection ratio, any noise that is on the power supply will be directly coupled to the output and will show up as noise on the eventual sensed image.

The inventors found that by adding a single transistor between the pixel power supply and the pixel op amp power, the PSRR is enhanced significantly. The added transistor, REG in FIG. 2 (200), is acting as a signal transistor regulator to increase the PSRR of the pixel.

An embodiment implements a voltage regulator with a single PMOS transistor 200 in the pixel. The in-pixel voltage regulator suppresses the noise from pixel power supply to the CTIA integration node; this in turn reduces the noise at the pixel output. By implementing this in-pixel voltage regulator to the CTIA OPAMP, the noise performance of the CTIA IR readout pixel with a single ended OPAMP is significantly improved.

Figure 1:
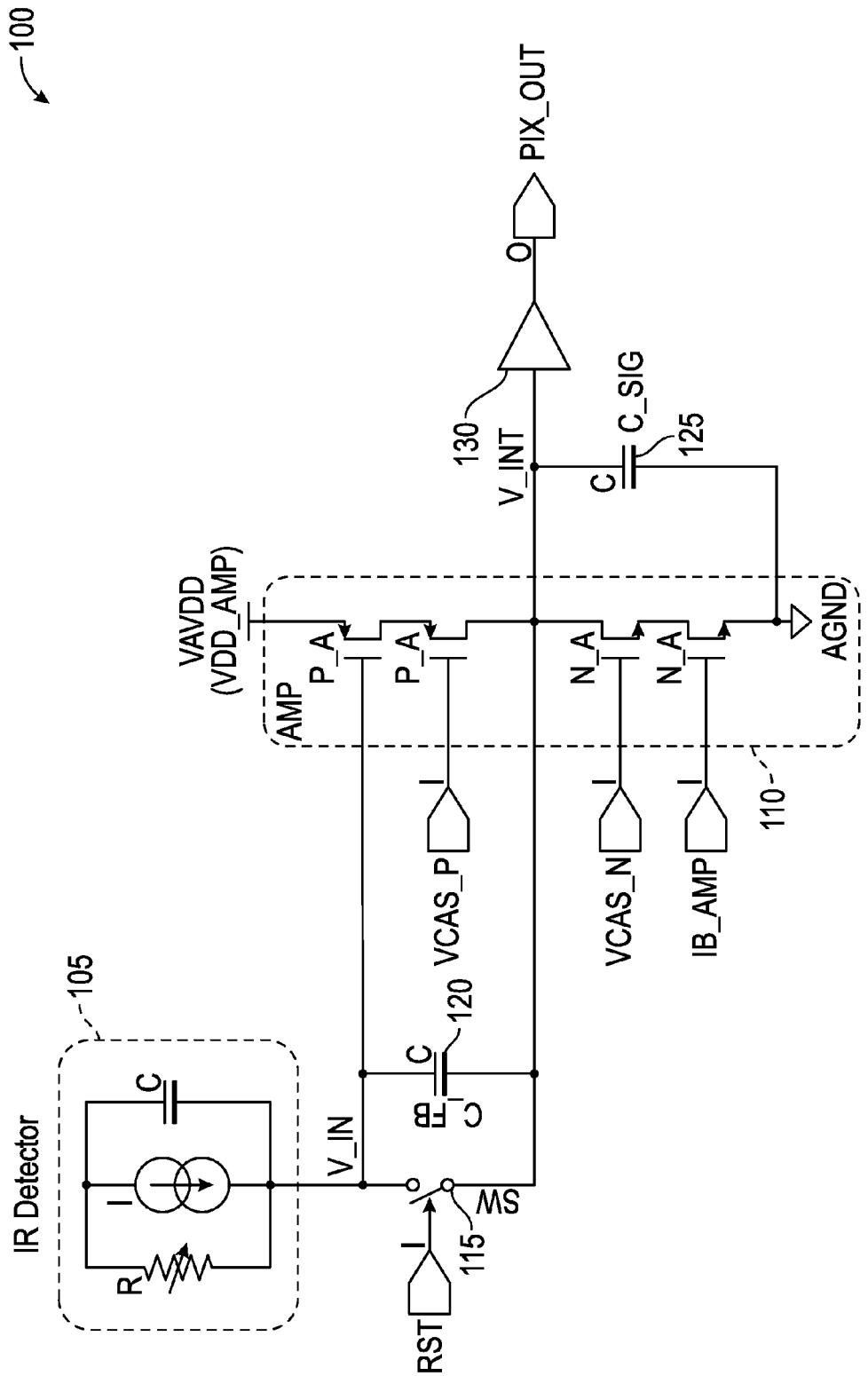
FIG. 1 shows a CTIA pixel with a single ended op amp.
Figure 2:
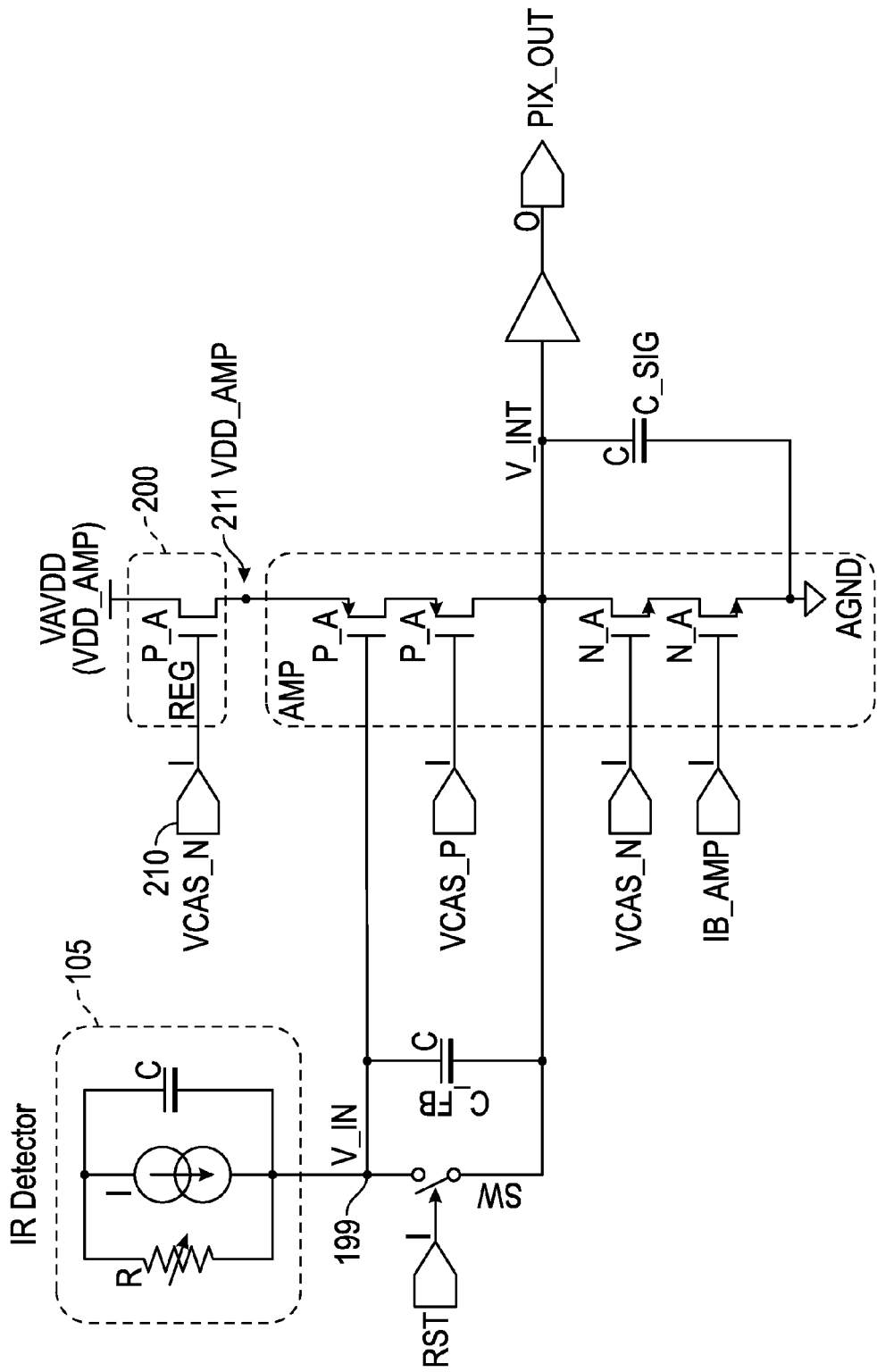
FIG. 2 shows a circuit of an embodiment.

As shown in FIG. 2, the IR detector 105 can be modeled as a current source in parallel with a resistor and a capacitor. The CTIA input node (V_IN) 199 is biased at a fixed voltage through the virtual ground of the OPAMP. During the reset phase (controlled by RST), the CTIA input node (V_IN) and output node (i.e., integration node V_INT) are set to the same voltage. The voltage is determined by the OPAMP power supply (VAVDD) and OPAMP bias current (IB_AMP).

After the reset phase, the reset switch is turned ON; CTIA input current from IR detector drives the integration node V_INT down, as a function of IR light intensity and integration time. The integrated signal is stored in signal sampling capacitor C_SIG.

A single ended OPAMP uses less number of transistors that can reduce the area of the pixel, however, the PSRR of the CTIA circuit is very poor (~0 dB). At IR image sensor ROIC applications, the noise of the pixel power supply could be very high because of the large number of pixels operating in parallel. Thus, it results high pixel output noise.

The point of using a single ended op amp is to reduce the pixel size. Accordingly, the inventors recognized that the regulator has to be as simple as possible. This embodiment implements a PMOS transistor 200 in FIG. 2 used as voltage regulator. The PMOS transistor 200 is biased with a bias voltage 210, which can be obtained from any source. This produces a modified VDD, called VDD_AMP 211, which is used to bias the single ended op amp 100.

The in-pixel regulator PMOS transistor gate bias voltage, VBIAS, is generated outside the pixel array as part of the regulator implementation. Since the circuit of generating VBIAS is outside the pixel array region, the pixel can keep a small size. By implementing the in-pixel regulator to the pixel, power supply noise coupling to the CTIA output can be suppressed significantly. That is suitable for low noise, small pixel, and large format IR detector ROIC applications.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, The operational amplifier shown as having 4 transistors, however it could have some other number of transistors such as two transistors. The operational amplify could be as less as two transistors, the input transistor and bias current transistor only.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the embodiments disclosed herein, may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, displayport, or any other form. This may include laptop or desktop computers, and may also include portable computers, including cell phones, tablets such as the IPAD™, and all other kinds of computers and computing platforms.

A processor can be used to control the operation, or alternatively the operation can be controlled by a controller. The processor may be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, using cloud computing, or in combinations. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of tangible storage medium that stores tangible, non transitory computer based instructions. An exemplary storage medium is coupled to the processor such that the processor can read information from, and write information to, the storage medium. In the alternative, the storage medium may be integral to the processor. The processor and the storage medium may reside in reconfigurable logic of any type.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

The memory storage can also be rotating magnetic hard disk drives, optical disk drives, or flash memory based storage drives or other such solid state, magnetic, or optical storage devices. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The computer readable media can be an article comprising a machine-readable non-transitory tangible medium embodying information indicative of instructions that when performed by one or more machines result in computer implemented operations comprising the actions described throughout this specification.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:
1. An image sensor pixel, comprising:
an input that receives information indicative of a photo generated signal level;
a single ended operational amplifier, located in said pixel, and receiving said input, said single ended operational amplifier amplifying said input; and a single transistor, located in said pixel and receiving a bias voltage and receiving a power supply voltage, and regulating said power supply voltage to create a regulated power supply voltage which regulated power supply voltage is used by said single ended operational amplifier.

2. The pixel as in claim 1, wherein said operational amplifier is formed with 4 transistors.

3. The pixel as in claim 1, further comprising an infrared photodetector providing said photo generated signal level.

4. The pixel as in claim 3, further comprising a capacitor, accumulating a level from said infrared photodetector.

5. The pixel as in claim 4, further comprising a reset transistor.

6. A method of processing information from an image sensor pixel, comprising:

receiving information indicative of a photogenerated signal level into a single ended operational amplifier, located in said pixel; and using a single transistor, located in said pixel to receive a bias voltage and receive a power supply voltage, and regulate said power supply voltage to create a regulated power supply voltage and use said regulated power supply voltage to power said single ended operational amplifier.

7. The method as in claim 6, wherein said operational amplifier is formed with 4 transistors.

8. The method as in claim 6, wherein said receiving comprises receiving from an infrared photodetector providing said photogenerated signal level.

9. The method as in claim 8, further comprising accumulating a level from said infrared photodetector.

10. The method as in claim 6, further comprising resetting said pixel.

* * * * *